(12) United States Patent
Connell et al.

(10) Patent No.: US 10,369,863 B2
(45) Date of Patent: Aug. 6, 2019

(54) REFRIGERANT LIQUID-GAS SEPARATOR WITH ELECTRONICS COOLING

(71) Applicant: Bergstrom, Inc., Rockford, IL (US)

(72) Inventors: Brett S. Connell, Winnebago, IL (US); Brett Herrmann, Rochelle, IL (US); Aaron D. Sullivan, Winnebago, IL (US); Terry Zeigler, Byron, IL (US)

(73) Assignee: Bergstrom, Inc., Rockford, IL (US)

( * ) Notice: Subject to any disclaimer, the term of this patent is extended or adjusted under 35 U.S.C. 154(b) by 6 days.

(21) Appl. No.: 15/283,150

(22) Filed: Sep. 30, 2016

(65) Prior Publication Data
US 2018/0093550 A1    Apr. 5, 2018

(51) Int. Cl.
| | | |
|---|---|---|
| *F25B 43/00* | (2006.01) | |
| *B60H 1/00* | (2006.01) | |
| *F25B 31/00* | (2006.01) | |
| *H05K 7/20* | (2006.01) | |

(52) U.S. Cl.
CPC ....... *B60H 1/00271* (2013.01); *F25B 31/006* (2013.01); *F25B 43/006* (2013.01); *B60H 1/00378* (2013.01); *B60H 2001/00307* (2013.01); *F25B 2400/051* (2013.01); *F25B 2400/23* (2013.01); *H05K 7/20936* (2013.01)

(58) Field of Classification Search
CPC .............. F25B 2400/23; F25B 43/006; H05K 7/20936; B60H 2001/00307
See application file for complete search history.

(56) References Cited

U.S. PATENT DOCUMENTS

| | | |
|---|---|---|
| 2,722,050 A | 11/1955 | Shank |
| 2,789,234 A | 6/1956 | Lambert et al. |
| 3,176,502 A | 4/1965 | Cizek et al. |
| (Continued) | | |

FOREIGN PATENT DOCUMENTS

| | | |
|---|---|---|
| CN | 1468409 A | 1/2004 |
| CN | 201872573 U | 6/2011 |
| (Continued) | | |

OTHER PUBLICATIONS

Alfa Laval Website http://www.alfalaval.com/ecore-Java/WebObjects/ecoreJava.woa/wa/shoNode?siteNodeID=1668&cont . . . ; date last visited May 18, 2007; 1 page.
(Continued)

*Primary Examiner* — David J Teitelbaum
(74) *Attorney, Agent, or Firm* — Morgan, Lewis & Bockius LLP

(57) ABSTRACT

The refrigerant liquid-gas separator is thermally coupled to electronics to transfer heat away from the electronics, and assist in vaporizing the liquid refrigerant. The liquid-gas separator device includes a refrigeration section configured to couple to a refrigeration loop, and an electronics board thermally coupled to the refrigeration section. The refrigeration section includes: (a) a refrigerant inlet configured to receive refrigerant from the refrigeration loop; (b) a refrigerant outlet configured to release vapor refrigerant to the refrigeration loop; and (c) a cavity coupled to the refrigerant inlet and the refrigerant outlet, the cavity configured to separate liquid refrigerant from vapor refrigerant. In use, heat from the electronics board is transferred to the refrigerant.

20 Claims, 8 Drawing Sheets

(56) References Cited

U.S. PATENT DOCUMENTS

| | | |
|---|---|---|
| 3,225,819 A | 12/1965 | Stevens |
| 3,590,910 A | 7/1971 | Lorenz |
| 3,627,030 A | 12/1971 | Lorenz |
| 3,807,087 A | 4/1974 | Staats |
| 3,844,130 A | 10/1974 | Wahnish |
| 3,880,224 A | 4/1975 | Weil |
| 3,885,398 A | 5/1975 | Dawkins |
| 3,948,060 A | 4/1976 | Gaspard |
| 3,995,443 A | 12/1976 | Iversen |
| 4,015,182 A | 3/1977 | Erdman |
| 4,034,801 A | 7/1977 | Bermstein |
| 4,071,080 A | 1/1978 | Bridgers |
| 4,217,764 A | 8/1980 | Armbruster |
| 4,271,677 A | 6/1981 | Harr |
| 4,280,330 A | 7/1981 | Harris et al. |
| 4,324,286 A | 4/1982 | Brett |
| 4,359,875 A | 11/1982 | Ohtani |
| 4,391,321 A | 7/1983 | Thunberg |
| 4,412,425 A | 11/1983 | Fukami |
| 4,448,157 A | 5/1984 | Eckstein et al. |
| 4,459,519 A | 7/1984 | Erdman |
| 4,577,679 A | 3/1986 | Hibshman |
| 4,604,036 A | 8/1986 | Sutou et al. |
| 4,617,472 A | 10/1986 | Slavik |
| 4,641,502 A | 2/1987 | Aldrich et al. |
| 4,658,593 A | 4/1987 | Stenvinkel |
| 4,667,480 A | 5/1987 | Bessler |
| 4,694,798 A | 9/1987 | Kato et al. |
| 4,748,825 A | 6/1988 | King |
| 4,825,663 A | 5/1989 | Nijar et al. |
| 4,841,733 A | 6/1989 | Dussault et al. |
| 4,856,078 A | 8/1989 | Konopka |
| 4,893,479 A | 1/1990 | Gillett et al. |
| 4,905,478 A | 3/1990 | Matsuda et al. |
| 4,945,977 A | 8/1990 | D'Agaro |
| 4,947,657 A | 8/1990 | Kalmbach |
| 4,952,283 A | 8/1990 | Besik |
| 4,982,576 A | 1/1991 | Proctor et al. |
| 5,025,634 A | 6/1991 | Dressler |
| 5,046,327 A | 9/1991 | Walker |
| 5,067,652 A | 11/1991 | Enander |
| 5,095,308 A | 3/1992 | Hewitt |
| 5,125,236 A | 6/1992 | Clancey et al. |
| 5,170,639 A | 12/1992 | Datta |
| 5,230,719 A | 7/1993 | Berner et al. |
| 5,275,012 A | 1/1994 | Dage et al. |
| 5,307,645 A | 5/1994 | Pannell |
| 5,316,074 A | 5/1994 | Isaji et al. |
| 5,324,229 A | 6/1994 | Weisbecker |
| 5,333,678 A | 8/1994 | Mellum et al. |
| 5,361,593 A | 11/1994 | Dauvergne |
| 5,376,866 A | 12/1994 | Erdman |
| 5,396,779 A | 3/1995 | Voss |
| 5,402,844 A | 4/1995 | Elluin |
| 5,404,730 A | 4/1995 | Westermeyer |
| 5,426,953 A | 6/1995 | Meckler |
| 5,465,589 A | 11/1995 | Bender et al. |
| 5,497,941 A | 3/1996 | Numazawa et al. |
| 5,501,267 A | 3/1996 | Iritani et al. |
| 5,502,365 A | 3/1996 | Nanbu et al. |
| 5,524,442 A | 6/1996 | Bergmen, Jr. et al. |
| 5,528,901 A | 6/1996 | Willis |
| 5,562,538 A | 10/1996 | Suyama |
| 5,586,613 A | 12/1996 | Ehsani |
| 5,647,534 A | 7/1997 | Kelz et al. |
| 5,657,638 A | 8/1997 | Erdman et al. |
| 5,682,757 A | 11/1997 | Peterson |
| 5,720,181 A | 2/1998 | Karl et al. |
| 5,761,918 A | 6/1998 | Jackson et al. |
| 5,775,415 A | 7/1998 | Yoshini et al. |
| 5,782,610 A | 7/1998 | Ikeda |
| 5,819,549 A | 10/1998 | Sherwood |
| 5,896,750 A | 4/1999 | Karl |
| 5,898,995 A | 5/1999 | Ghodbane |
| 5,899,081 A | 5/1999 | Evans et al. |
| 5,901,572 A | 5/1999 | Peiffer et al. |
| 5,901,780 A | 5/1999 | Zeigler et al. |
| 5,921,092 A | 7/1999 | Behr et al. |
| 5,934,089 A | 8/1999 | Magakawa et al. |
| 5,982,643 A | 11/1999 | Phlipot |
| 5,996,363 A | 12/1999 | Kurachi et al. |
| 6,016,662 A | 1/2000 | Tanaka et al. |
| 6,028,406 A | 2/2000 | Birk |
| 6,038,877 A | 3/2000 | Peiffer et al. |
| 6,038,879 A | 3/2000 | Turcotte |
| 6,059,016 A | 5/2000 | Rafalovich et al. |
| 6,073,456 A | 6/2000 | Kawai et al. |
| 6,111,731 A | 8/2000 | Cepynsky |
| 6,112,535 A | 9/2000 | Hollenbeck |
| 6,125,642 A | 10/2000 | Seener et al. |
| 6,134,901 A | 10/2000 | Harvest et al. |
| 6,152,217 A | 11/2000 | Ito et al. |
| 6,185,959 B1 | 2/2001 | Zajac |
| 6,193,475 B1 | 2/2001 | Rozek |
| 6,205,795 B1 | 3/2001 | Backman et al. |
| 6,205,802 B1 | 3/2001 | Drucker et al. |
| 6,209,333 B1 | 4/2001 | Bascobert |
| 6,209,622 B1 | 4/2001 | Lagace et al. |
| 6,213,867 B1 | 4/2001 | Yazici |
| 6,230,507 B1 | 5/2001 | Ban et al. |
| 6,253,563 B1 | 7/2001 | Ewert et al. |
| 6,265,692 B1 | 7/2001 | Umebayahi et al. |
| 6,276,161 B1 | 8/2001 | Peiffer et al. |
| 6,282,919 B1 | 9/2001 | Rockenfeller |
| 6,351,957 B2 | 3/2002 | Hara |
| 6,405,793 B1 | 6/2002 | Ghodbane et al. |
| 6,411,059 B2 | 6/2002 | Frugier et al. |
| 6,453,678 B1 | 9/2002 | Sundhar |
| 6,457,324 B2 | 10/2002 | Zeigler et al. |
| 6,467,279 B1 | 10/2002 | Backman et al. |
| 6,474,081 B1 | 11/2002 | Feuerecker |
| 6,530,426 B1 | 3/2003 | Kishita et al. |
| 6,543,245 B1 | 4/2003 | Waldschmidt |
| 6,571,566 B1 | 6/2003 | Temple et al. |
| 6,575,228 B1 | 6/2003 | Ragland et al. |
| 6,626,003 B1 | 9/2003 | Kortüm et al. |
| 6,675,601 B2 | 1/2004 | Ebara |
| 6,684,863 B2 | 2/2004 | Dixon et al. |
| 6,725,134 B2 | 4/2004 | Dillen et al. |
| 6,745,585 B2 | 6/2004 | Kelm et al. |
| 6,748,750 B2 | 6/2004 | Choi |
| 6,758,049 B2 | 7/2004 | Adachi et al. |
| 6,889,762 B2 | 5/2005 | Zeigler et al. |
| 6,932,148 B1 | 8/2005 | Brummett et al. |
| 6,939,114 B2 | 9/2005 | Iwanami et al. |
| 6,965,818 B2 | 11/2005 | Koenig et al. |
| 6,981,544 B2 | 1/2006 | Iwanami et al. |
| 7,150,159 B1 | 12/2006 | Brummett et al. |
| 7,246,502 B2 | 7/2007 | Hammonds et al. |
| 7,316,119 B2 | 1/2008 | Allen |
| 7,350,368 B2 | 4/2008 | Heberle et al. |
| 7,591,143 B2 | 9/2009 | Zeigler et al. |
| 7,591,303 B2 | 9/2009 | Ziegler et al. |
| 7,614,242 B1 | 11/2009 | Quesada Saborio |
| 7,637,031 B2 | 12/2009 | Salim et al. |
| 7,765,824 B2 | 8/2010 | Wong et al. |
| 8,001,799 B2 | 8/2011 | Obayashi et al. |
| 8,141,377 B2 | 3/2012 | Connell |
| 8,156,754 B2 | 4/2012 | Hong et al. |
| 8,276,892 B2 | 10/2012 | Narikawa et al. |
| 8,517,087 B2 | 8/2013 | Zeigler et al. |
| 8,821,092 B2 | 9/2014 | Nambara et al. |
| 8,905,071 B2 | 12/2014 | Coombs et al. |
| 8,919,140 B2 | 12/2014 | Johnson et al. |
| 8,947,531 B2 | 2/2015 | Fischer et al. |
| 9,157,670 B2 | 10/2015 | Kreeley et al. |
| 9,216,628 B2 | 12/2015 | Self et al. |
| 9,783,024 B2 | 10/2017 | Connell et al. |
| 9,878,591 B2 | 1/2018 | Taniguchi et al. |
| 2001/0010261 A1 | 8/2001 | Oomura et al. |
| 2002/0020183 A1 | 2/2002 | Hayashi |
| 2002/0026801 A1 | 3/2002 | Yamashita |
| 2002/0036081 A1 | 3/2002 | Ito et al. |
| 2002/0042248 A1 | 4/2002 | Vincent et al. |

(56) References Cited

U.S. PATENT DOCUMENTS

| | | |
|---|---|---|
| 2002/0078700 A1 | 6/2002 | Kelm et al. |
| 2002/0084769 A1 | 7/2002 | Iritani et al. |
| 2002/0108384 A1 | 8/2002 | Higashiyama |
| 2002/0112489 A1 | 8/2002 | Egawa et al. |
| 2002/0157412 A1 | 10/2002 | Iwanami et al. |
| 2002/0157413 A1 | 10/2002 | Iwanami et al. |
| 2003/0041603 A1 | 3/2003 | Tada et al. |
| 2003/0105567 A1 | 6/2003 | Koenig et al. |
| 2003/0106332 A1 | 6/2003 | Okamoto |
| 2004/0060312 A1 | 4/2004 | Horn et al. |
| 2004/0168449 A1 | 9/2004 | Homan et al. |
| 2004/0216477 A1 | 11/2004 | Yamasaki et al. |
| 2004/0221599 A1 | 11/2004 | Hille et al. |
| 2004/0256082 A1 | 12/2004 | Bracciano |
| 2005/0016196 A1 | 1/2005 | Kadle et al. |
| 2005/0109499 A1 | 5/2005 | Iwanami et al. |
| 2005/0161211 A1 | 7/2005 | Zeigler et al. |
| 2005/0230096 A1 | 10/2005 | Yamaoka |
| 2005/0257545 A1 | 11/2005 | Ziehr et al. |
| 2006/0042284 A1 | 3/2006 | Heberle et al. |
| 2006/0080980 A1 | 4/2006 | Lee et al. |
| 2006/0102333 A1 | 5/2006 | Zeigler et al. |
| 2006/0118290 A1 | 6/2006 | Klassen et al. |
| 2006/0151163 A1 | 7/2006 | Zeigler et al. |
| 2006/0151164 A1 | 7/2006 | Zeigler et al. |
| 2006/0254309 A1* | 11/2006 | Takeuchi ............ F01C 11/004 62/501 |
| 2007/0070605 A1* | 3/2007 | Straznicky ......... H01L 23/4338 361/702 |
| 2007/0101760 A1* | 5/2007 | Bergander ............... F25B 1/06 62/500 |
| 2007/0131408 A1 | 6/2007 | Zeigler et al. |
| 2007/0144728 A1 | 6/2007 | Kinmartin et al. |
| 2007/0163276 A1 | 7/2007 | Braun et al. |
| 2007/0227167 A1 | 10/2007 | Shapiro |
| 2008/0017347 A1 | 1/2008 | Chung et al. |
| 2008/0110185 A1 | 5/2008 | Veettil et al. |
| 2008/0156887 A1 | 7/2008 | Stanimirovic |
| 2008/0196436 A1 | 8/2008 | Connell |
| 2008/0196877 A1 | 8/2008 | Zeigler et al. |
| 2008/0209924 A1 | 9/2008 | Yoon et al. |
| 2009/0211280 A1 | 8/2009 | Alston |
| 2009/0229288 A1 | 9/2009 | Alston et al. |
| 2009/0241592 A1 | 10/2009 | Stover |
| 2009/0249802 A1 | 10/2009 | Nemesh et al. |
| 2009/0301702 A1 | 12/2009 | Zeigler et al. |
| 2010/0009620 A1 | 1/2010 | Kawato et al. |
| 2010/0218530 A1 | 9/2010 | Melbostad et al. |
| 2010/0263395 A1 | 10/2010 | Adachi et al. |
| 2011/0088417 A1 | 4/2011 | Kayser |
| 2011/0120146 A1 | 5/2011 | Ota et al. |
| 2011/0126566 A1 | 6/2011 | Jones et al. |
| 2011/0174014 A1* | 7/2011 | Scarcella ................. F25B 1/10 62/510 |
| 2011/0308265 A1 | 12/2011 | Phannavong |
| 2012/0102779 A1 | 5/2012 | Beers et al. |
| 2012/0118532 A1 | 5/2012 | Jentzsch et al. |
| 2012/0133176 A1 | 5/2012 | Ramberg |
| 2012/0247135 A1 | 10/2012 | Fakieh |
| 2012/0297805 A1 | 11/2012 | Kamada et al. |
| 2012/0318014 A1 | 12/2012 | Huff et al. |
| 2013/0040549 A1 | 2/2013 | Douglas et al. |
| 2013/0091867 A1 | 4/2013 | Campbell et al. |
| 2013/0145781 A1 | 6/2013 | Liu |
| 2013/0167577 A1 | 7/2013 | Street |
| 2013/0319630 A1 | 12/2013 | Yamamoto |
| 2014/0066572 A1 | 3/2014 | Corveleyn |
| 2014/0075973 A1 | 3/2014 | Graaf et al. |
| 2014/0102679 A1 | 4/2014 | Matsudaira et al. |
| 2014/0241926 A1 | 8/2014 | Fraser |
| 2014/0290299 A1 | 10/2014 | Nakaya |
| 2015/0158368 A1 | 6/2015 | Herr-Rathke et al. |
| 2015/0210287 A1 | 7/2015 | Penilla et al. |
| 2015/0236525 A1 | 8/2015 | Aridome |
| 2015/0239365 A1 | 8/2015 | Hyde et al. |
| 2015/0306937 A1 | 10/2015 | Kitamura et al. |
| 2016/0089958 A1 | 3/2016 | Powell |
| 2016/0144685 A1 | 5/2016 | Ochiai et al. |
| 2016/0146554 A1 | 5/2016 | Bhatia et al. |
| 2016/0229266 A1 | 8/2016 | Maeda et al. |
| 2017/0211855 A1 | 7/2017 | Fraser et al. |
| 2017/0350632 A1 | 12/2017 | Hirao |

FOREIGN PATENT DOCUMENTS

| | | |
|---|---|---|
| CN | 102398496 A | 4/2012 |
| CN | 103547466 A | 1/2014 |
| CN | 104105610 A | 10/2014 |
| DE | 4440044 A1 | 5/1996 |
| DE | 10014483 A1 | 11/2000 |
| DE | 199 54 308 A1 | 7/2001 |
| DE | 102005004950 A1 | 8/2006 |
| DE | 10 2007 028851 A1 | 12/2008 |
| DE | 102010054965 A1 | 6/2012 |
| DE | 11 2015 000552 | 11/2016 |
| EP | 0516413 A1 | 12/1992 |
| EP | 0958952 A1 | 11/1999 |
| EP | 1024038 A2 | 8/2000 |
| EP | 1 477 748 A1 | 11/2004 |
| EP | 1 700 725 A1 | 9/2006 |
| EP | 1 703 231 A1 | 9/2006 |
| EP | 1 970 651 A1 | 9/2008 |
| EP | 2048011 A1 | 4/2009 |
| EP | 2196748 A2 | 6/2010 |
| EP | 2320160 A1 | 5/2011 |
| EP | 2894420 A1 | 7/2015 |
| EP | 0963895 A2 | 12/2015 |
| EP | 3118035 A1 | 1/2017 |
| FR | 2966391 A1 | 4/2012 |
| JP | H02-128915 A | 5/1990 |
| JP | 5032121 A | 2/1993 |
| JP | H07186711 A | 7/1995 |
| JP | H97-76740 A | 3/1997 |
| JP | H09318177 A | 12/1997 |
| JP | H10281595 A | 10/1998 |
| JP | 2000108651 A | 4/2000 |
| JP | 2005044551 A | 4/2000 |
| JP | 2002081823 A | 3/2002 |
| JP | 2006-264568 A | 10/2006 |
| JP | 2008220043 A | 9/2008 |
| JP | 2012017029 A | 1/2012 |
| JP | 2014226979 A | 12/2014 |
| KR | 20090068136 A | 6/2009 |
| WO | WO 89/09143 A1 | 10/1989 |
| WO | WO 99/61269 | 12/1999 |
| WO | WO 00/00361 | 1/2000 |
| WO | WO 2006/082082 A1 | 8/2006 |
| WO | WO 2012/158326 A1 | 11/2012 |
| WO | WO 2014/112320 A1 | 7/2014 |
| WO | WO 2014/180749 A1 | 11/2014 |
| WO | WO 2014/209780 A1 | 12/2014 |
| WO | WO 2015/076872 A1 | 5/2015 |

OTHER PUBLICATIONS

Anonymous: "NITE Connected Climate Controlled Transport Monitoring/Mobile Internet of Things UI Design/Mobil UI: Progress/Printeres/Internet of Things, User Inter . . . ," Oct. 19, 2016 retrieved from: URL:htps://za.pinterest.com/pin/192810427773981541/, 1 pg.

Bergstrom, Inc., International Search Report and Written Opinion, PCT/US2014/026687, dated Jul. 28, 2014, 12 pgs.

Bergstrom, Inc., International Preliminary Report on Patentability, PCT/US2014/026687, dated Sep. 15, 2015, 7 pgs.

Bergstrom, Inc., International Search Report and Written Opinion, PCT/US2014/026683, dated Jul. 3, 2014 12 pgs.

Bergstrom, Inc., International Preliminary Report on Patentability, PCT/US2014/026683, dated Sep. 15, 2015, 6 pgs.

Bergstrom, Inc., International Search Report and Written Opinion, PCT/US2013/068331, dated Nov. 7, 2014, 9 pgs.

Bergstrom, Inc., International Preliminary Report on Patentability, PCT/US2013/068331, dated May 10, 2016, 6 pgs.

(56) References Cited

OTHER PUBLICATIONS

Bergstrom, Inc., International Search Report and Written Opinion, PCT/US2016/021602, dated Nov. 3, 2016, 7 pgs.
Bergstrom, Inc., International Preliminary Report on Patentability, PCT/US2016/021602, dated Sep. 12, 2017, 11 pgs.
Bergstrom, Inc., International Search Report and Written Opinion, PCT/US2017/021346, dated Jul. 25, 2017, 11 pgs.
Bergstrom, Inc., International Search Report and Written Opinion, PCT/US2016/065812, dated Mar. 22, 2017, 12 pgs.
Bergstrom, Inc., International Preliminary Report on Patentability, PCT/US2016/065812, dated Jun. 12, 2018, 8 pgs.
Bergstrom, Inc., Communication Pursuant to Rules 161(2) and 162 EPC, EP14717604.4, dated Oct. 23, 2015, 2 pgs.
Bergstrom, Inc., Communication Pursuant to Article 94(3), EP14717604.4, dated Jun. 2, 2017, 12 pgs.
Bergstrom, Inc., Communication Pursuant to Rules 161(2) and 162 EPC, EP14722438.0, dated Nov. 2, 2015. 2 pgs.
Bergstrom, Inc. Communication Pursuant to Article 94(3), EP14722438.0, dated Jan. 24, 2018, 5 pgs.
Bergstrom, Inc., Communication Pursuant to Rules 161(2) and 162 EPC, EP13795064.8, dated Jun. 22, 2016, 2 pgs.
Bergstrom, Inc. Extended European Search Report, EP16204254.3, dated Jul. 25, 2017, 8 pgs.
Bergstrom, Inc. Partial European Search Report, EP16204259.2, dated May 30, 2017, 14 pgs.
Bergstrom, Inc. Extended European Search Report, EP16204259.2, dated Oct. 25, 2017, 15 pgs.
Bergstrom, Inc. Corrected Extended European Search Report, EP16204259.2, dated Nov. 24, 2017, 15 pgs.
Bergstrom, Inc. Partial European Search Report, EP16204256.8, dated Jul. 13, 2017, 14 pgs.
Bergstrom, Inc. Extended European Search Report, EP16204256.8, dated Jan. 12, 2018, 11 pgs.
Bergstrom, Inc. Extended European Search Report, EP16204256.8, dated Dec. 1, 2017, 13 pgs.
Bergstrom, Inc. Extended European Search Report, EP16204267.5, dated Jul. 11, 2017, 8 pgs.
Bergstrom, Inc., Office Action, CN201480027137.4, dated Mar. 3, 2017, 15 pgs.
Bergstrom, Inc., 2nd Office Action, CN201480027137.4, dated Jul. 13, 2017, 10 pgs.
Bergstrom, Inc., 3rd Office Action, CN201480027137.4, dated Jan. 17, 2018, 19 pgs.
Bergstrom, Inc., Office Action, CN201480027117.7, dated Mar. 9, 2017, 8 pgs.
Bergstrom, Inc., Patent Certificate, CN201480027117.7, dated Nov. 21, 2017, 3 pgs.
Bergstrom, Inc., 2nd Office Action, CN201380081940.1, dated Jan. 17, 2018, 13 pgs.
Bergstrom, Inc., 4th Office Action, CN201480027137.4, dated Jul. 26, 2018, 8 pgs.
Connell, Office Action, U.S. Appl. No. 14/209,877, dated Nov. 27, 2015, 19 pgs.
Connell, Final Office Action, U.S. Appl. No. 14/209,877, dated Jun. 22, 2016, 17 pgs.
Connell, Final Office Action, U.S. Appl. No. 14/209,877, dated Dec. 29, 2016, 21 pgs.
Connell, Notice of Allowance, U.S. Appl. No. 14/209,877, dated May 16, 2017, 5 pgs.
Connell, Notice of Allowance, U.S. Appl. No. 14/209,877, dated Aug. 4, 2017, 7 pgs.
Connell, Office Action, U.S. Appl. No. 14/209,961, dated Dec. 2, 2015, 14 pgs.
Connell, Final Office Action, U.S. Appl. No. 14/209,961, dated Jul. 25, 2016, 15 pgs.
Connell, Notice of Allowance, U.S. Appl. No. 14/209,961, dated Jun. 15, 2017, 10 pgs.
Connell, Notice of Allowance, U.S. Appl. No. 15/064,552, dated Jun. 1, 2017, 9 pgs.
Connell, Notice of Allowance, U.S. Appl. No. 14/995,119, dated Aug. 31, 2017, 7 pgs.
Connell, Office Action, U.S. Appl. No. 14/965,142, dated Aug. 29, 2017, 12 pgs.
Connell, Notice of Allowance, U.S. Appl. No. 14/965,142, dated Feb. 26, 2018, 8 pgs.
Connell, Office Action, U.S. Appl. No. 15/280,876, dated Dec. 14, 2017, 23 pgs.
Connell, Notice of Allowance, U.S. Appl. No. 15/280,876, dated Jun. 21, 2018, 8 pgs.
Connell, Office Action, U.S. Appl. No. 15/791,243, dated May 8, 2018, 12 pgs.
Connell, Office Action, U.S. Appl. No. 15/065,745, dated May 31, 2018, 44 pgs.
FlatPlate Heat Exchangers; GEA FlatPlate Inc.; website—http://www.flatplate.com/profile.html; date last visited Aug. 9, 2007; 3 pages.
Glacier Bay Inc., Glacier Bay's Home Page, page printed from a website, htt(?:i/web.archive.org/web/19990417062255/htt[2://www.glacierbay.com/, apparent archive date: Apr. 17, 1999, 1 page.
Glacier Bay Inc., Darpa/Glacier Bay ECS, pages printed from a website, httir//web.archive.org/web/19991104132941/wvvw.glacierbay.com/darQatxt.htm, apparent archive date: Nov. 4, 1999, 2 pages.
Glacier Bay Inc., Glacier Bay ECS DARPA Project—Final Report, pages printed from a website, httn://web.archive.or_gjweb/19991103001512/v•vww,_g.Jacierbay.com/Darnhtm.htm, apparent archive date: Nov. 3, 1999, 9 pages.
Glacier Bay Inc., Glacier Bay ECS DARPA Project—Project Photos, pages printed from a website, httg://web.archive.org/web/19991103012854/www.glacierbay.com/Dargghotos.htm, apparent archive date: Nov. 3, 1999, 2 pages.
Glacier Bay Inc., Glacier Bay ECS DARPA Project—Operational Video, page printed from a website, httQ://web.archive.orq/web/19991022221040/wvvw.qlacierbay.com/DarQvid.htm, apparent archive date Oct. 22, 1999; 1 page.
Glacier Bay Inc., R & D, pages printed from a website, htt://web.archive.org/web/20000121130306/www.glacierbay.com/R&D.htm, apparent archive date: Jan. 21, 2000, 2 pages.
Glacier Bay Inc., Company History, pages printed from a website, httg://web.archive.org/web/20000301153828/www.g!acierbay.corn/History:.htrn, apparent archive date: Mar. 1, 2000; 2 pages.
Glacier Bay Inc., Contact, page printed from a website, httQ://web.archive.orq/web/19990508104511/W\"'I!V.qlacierba:t.com/Contact.htm, apparent archive date: May 8, 1999; 1 page.
Michael Löhle, Günther Feuerecker and Ulrich Salzer; Non Idling HVAC-modufe tor Long Distance Trucks;SAE TechnicalPaper Series 1999-01-1193; International Congress and Exposition, Detroit, Michigan; Mar. 1-4, 1999; 8 pages.
Mahmoud Ghodbane; On Vehicle Performance of a Secondary Loop A/C System; SAE Technical Paper Series 2000-01-1270; SAE 2000 World Congress, Detroit, Michigan; Mar. 6-9, 2000; 6 pages.
Masami Konaka and Hiroki Matsuo; SAE Technical Paper Series 2000-01-1271; SAE 2000 World Congress, Detroit, Michigan; Mar. 6-9, 2000; 7 pages.
Mayo Mayo, Office Action, U.S. Appl. No. 15/034,517, dated Feb. 21, 2018, 22 pgs.
Mayo Mayo, Final Office Action, U.S. Appl. No. 15/034,517, dated Aug. 28, 2018, 9 pgs.
Frank Stodolsky, Linda Gaines, and Anant Vyas; Analysis of Technology Options to Reduce the Fuel Consumption of Idling Trucks; Paper-Center for Transportation Research, Energy Systems Division, Argonne National Laboratory,9700 South Cass Avenue, Argonne, Illinois 60439;Jun. 2000; 30 pages.
Paper No. 26 in IPR2012-00027, Jun. 11, 2013, 12 pgs. (U.S. Pat. No. 7,591,303).
Patricia Gardie and Vincent Goetz; Thermal Energy Storage System by Solid Absorption for Electric Automobile Heating and Air-Conditioning; Paper; 1995, 5 pages.
TropiCool No-idle Heating & Cooling, 110V/12V High-efficiency, Self-contained, Electrified Heating/AC System; ACC Climate Control Brochure, Elkhart, Indiana; 2005, 1 page.
TropiCool Power Plus, More comfort. More efficiency. More options.; ACC Climate Control Brochure, Elkhart, Indiana; 2006, 3 pages.

(56) References Cited

OTHER PUBLICATIONS

Packless Industries, the leader in refrigerant to water coaxial heat exchangers, flexible hoses and sucti . . . ; website—http://www.packless.com/profile.htmle: date last visited Aug. 9, 2007; 1 page.
Zeigler, Office Action, U.S. Appl. No. 13/661,519, dated Mar. 11, 2013, 8 pgs.
Zeigler, Final Office Action, U.S. Appl. No. 13/661,519, dated Sep. 18, 2013, 15 pgs.
Zeigler, Office Action, U.S. Appl. No. 13/661,519, dated Apr. 9, 2014, 20 pgs.
Zeigler, Final Office Action, U.S. Appl. No. 13/661,519, dated Sep. 26, 2014, 23 pgs.
Zeigler, Office Action, U.S. Appl. No. 13/661,519, dated Oct. 28, 2015, 20 pgs.
Zeigler, Notice of Allowance, U.S. Appl. No. 13/661,519, dated Jun. 17, 2016, 8 pgs.
Bergstrom, Inc., International Search Report and Written Opinion, PCT/US2015/044093, dated Oct. 25, 2018, 13 pgs.
Bergstrom, Inc., Communication Pursuant to Article 94(3), EP14717604.4, dated Feb. 4, 2019, 5 pgs.
Bergstrom, Inc. Extended European Search Report, EP18177850.7, dated Nov. 28, 2018. 8 pgs.
Bergstrom, Inc., Notification of Grant, CN201480027137.4, dated Feb. 21, 2019, 1 pg.
Bergstrom, Inc., 3rd Office Action, CN201380081940.1, dated Jul. 30, 2018, 7 pgs.
Bergstrom, Inc., 1st Office Action, CN201680002224.3, dated Dec. 11, 2018, 5 pgs.
Connell, Final Office Action, U.S. Appl. No. 15/065,745, dated Dec. 17, 2018, 27 pgs.
Connell, Office Action, U.S. Appl. No. 15/283,150, dated Sep. 27, 2018, 21pgs.
Mayo Mayo, Final Office Action, U.S. Appl. No. 15/034,517, dated Nov. 30, 2018, 7 pgs.
Hansson, Office Action dated Oct. 5, 2018, U.S. Appl. No. 15/256,109, 14pgs.
Connell, Office Action, dated Oct. 19, 2018, U.S. Appl. No. 15/722,860, 7 pgs.
Connell, Notice of Allowance, U.S. Appl. No. 15/791,243, dated Jan. 24, 2019, 7 pgs.

\* cited by examiner

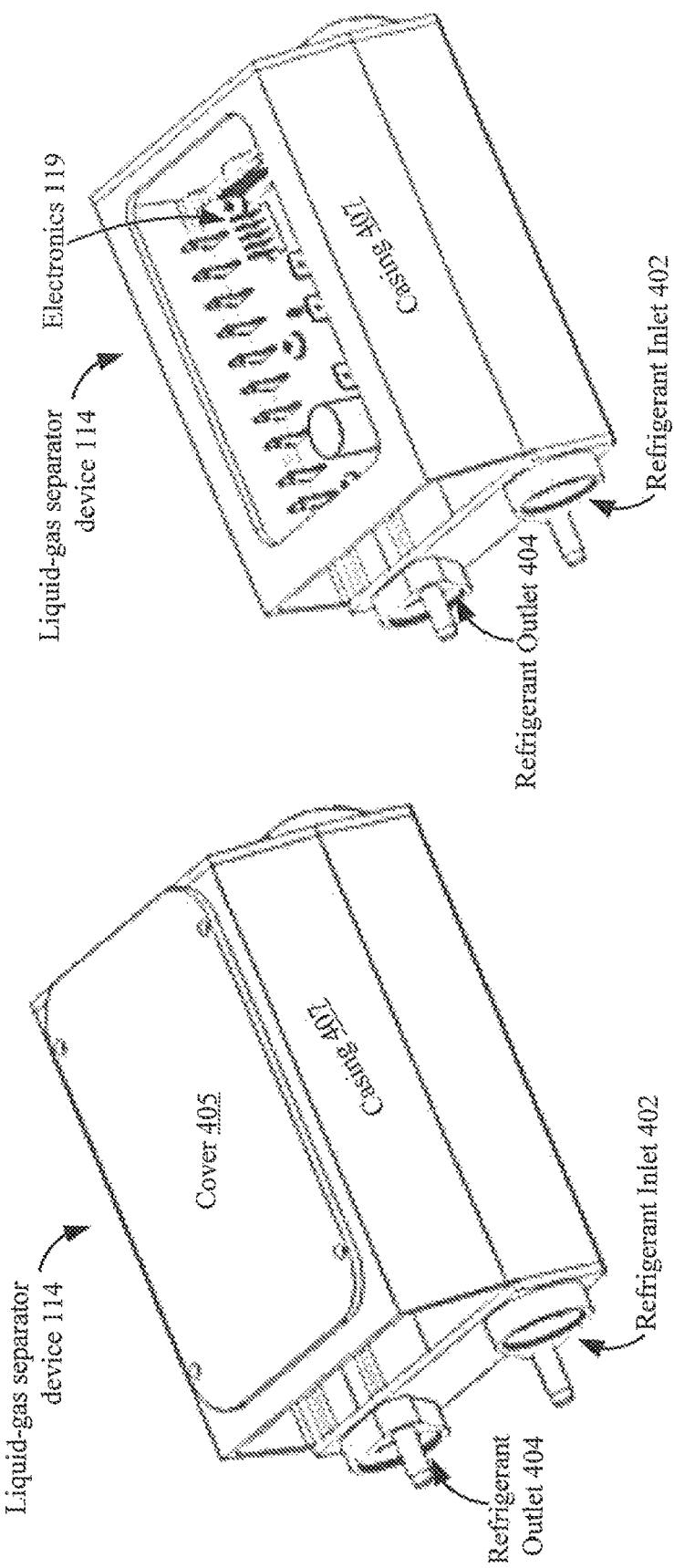

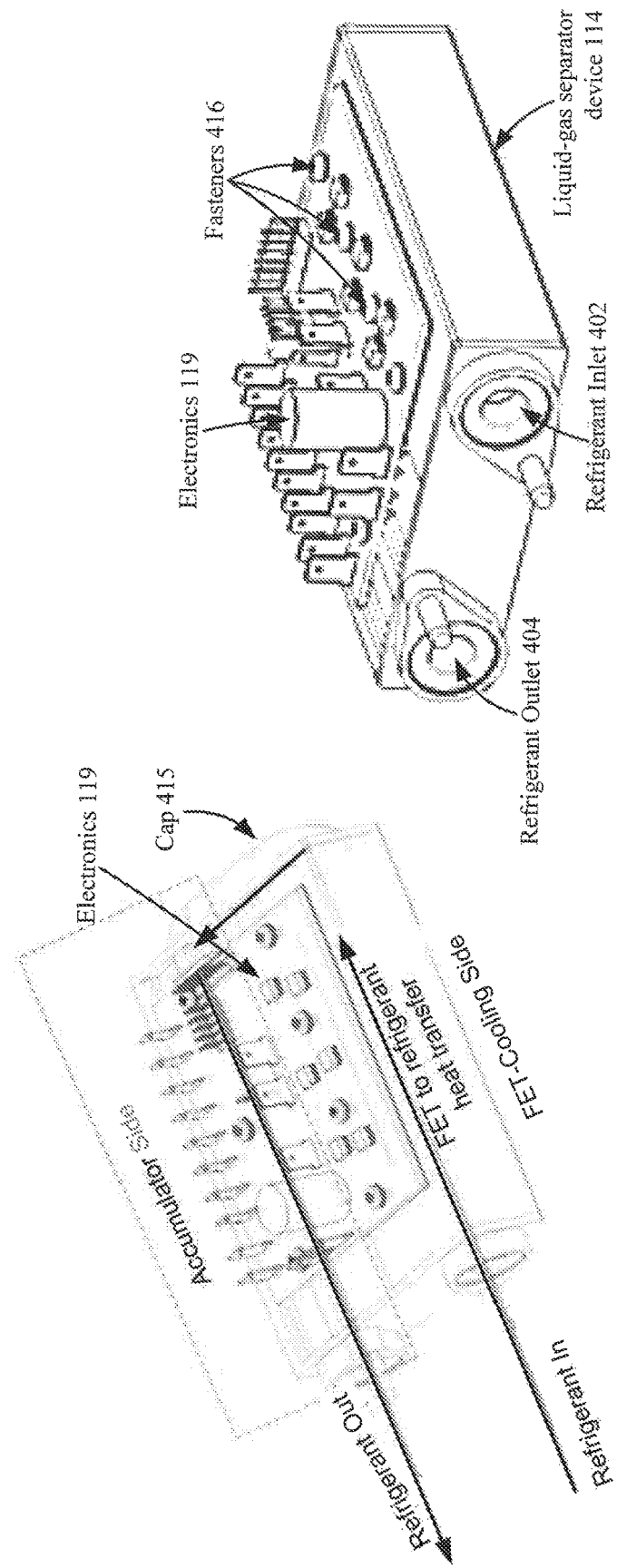

REFRIGERANT LIQUID-GAS SEPARATOR WITH ELECTRONICS COOLING

TECHNICAL FIELD

This relates generally to air-conditioning systems, including but not limited to, a vehicle air-conditioning system having a refrigerant liquid-gas separator with integrated controller electronics.

BACKGROUND

Heating and overheating are serious issues for electronics. In general, as electronics heat up, leakage currents increase, thermal noise increases, dopants may migrate, and/or the crystalline structure of Silicon components may break down. This can lead to malfunctioning components or a complete device failure. In addition, electronics at higher temperatures tend to require more power to operate.

This problem particularly acute in vehicle electronics systems, particularly those in or near the engine compartment, which tend to be exposed to high temperatures. Thus, cooling for these electronics is of particular importance.

Another problem in vehicle systems relates to the air conditioning system. Most vehicle air conditioning systems function by converting a refrigerant between vapor and liquid forms using a compressor. However, as the refrigerant is typically circulated around a closed-circuit loop, it is possible that liquid refrigerant can enter, and damage, the compressor. Therefore, an accumulator, or other liquid-gas separator device, is sometimes used to store or accumulate liquid refrigerant and prevent it from entering the compressor. By doing so, the accumulator helps prevent liquid refrigerant from entering the compressor. Over time, however, too much liquid refrigerant may accumulate in the liquid-gas separator device.

SUMMARY

Accordingly, there is a need for systems and/or devices with more efficient, compact, and cost-effective methods for cooling electronics and/or improving evaporation rates in an air-conditioning system. Such systems, devices, and methods optionally complement or replace conventional systems, devices, and methods for cooling electronics and/or improving evaporation rates in an air-conditioning system.

(A1) Some implementations include a refrigerant system comprising: a liquid-gas separator device including: (1) a refrigeration section configured to couple to a refrigeration loop, the refrigeration section comprising: (a) a refrigerant inlet configured to receive refrigerant from the refrigeration loop; (b) a refrigerant outlet configured to release vapor refrigerant to the refrigeration loop; and (c) a cavity coupled to the refrigerant inlet and the refrigerant outlet, the cavity configured to separate liquid refrigerant from vapor refrigerant; and (2) an electronics board thermally coupled to the refrigeration section, such that in use, heat from the electronics board is transferred to the refrigerant.

(A2) In some of the implementations above, the system further includes a compressor coupled downstream to the refrigerant outlet of the liquid-gas separator device, the compressor configured to compress refrigerant released by the liquid-gas separator device.

(A3) In some of the implementations above, the system further includes an evaporator coupled upstream to the refrigerant inlet of the liquid-gas separator device, the evaporator configured to evaporate refrigerant.

(A4) in some of the implementations above, the system further includes a condenser coupled upstream to the evaporator and downstream to the compressor, the condenser configured to condense refrigerant that has been compressed by the compressor.

(A5) In some of the implementations above, the electronics board is thermally coupled to the refrigeration section, such that in use, the heat transferred to the refrigerant converts at least a portion of the refrigerant from liquid refrigerant to vapor refrigerant.

(A6) in some of the implementations above, the electronics board is thermally coupled to the refrigeration section, such that in use, the heat transferred from the electronics boards cools electrical components on the electronics board.

(A7) In some of the implementations above, the liquid-gas separator device further includes compressor controller electronics mounted on the electronics board.

(A8) In some of the implementations above, the liquid-gas separator device further includes, mounted on the electronics board, at least one of: (a) a direct current (DC) to DC converter; (b) an alternating current (AC) to AC converter; (c) a DC to AC converter; (d) an AC to DC converter; (e) a power converter component; and (f) a transformer.

(A9) in some of the implementations above, the liquid-gas separator device further includes one or more additional electronics boards thermally coupled to the refrigeration section, such that in use heat from the one or more additional electronics boards is transferred to the refrigerant.

(A10) In some of the implementations above, the liquid-gas separator device further includes a liquid-vapor separator within the cavity, the liquid-vapor separator coupled to the refrigerant outlet and configured to impede the liquid refrigerant from being released via the refrigerant outlet.

(A11) In some of the implementations above, the liquid-vapor separator is configured to utilize gravity to prevent the liquid refrigerant from being released via the refrigerant outlet.

(A12) In some of the implementations above, the liquid-gas separator device includes connectors to mount to an inside of a vehicle engine compartment.

(A13) In some of the implementations above: (1) the liquid-gas separator device further includes one or more fasteners configured to secure the electronics board to the refrigeration section; and (2) the electronics board is thermally coupled to the first cavity via the one or more fasteners.

(A14) in some of the implementations above, the electronics board is thermally coupled to the first cavity via a thermal material.

(A15) In some of the implementations above, the refrigeration section is configured to withstand pressure exerted by refrigerant within the cavity.

(A16) In some of the implementations above, the liquid-gas separator device further includes a second refrigerant outlet distinct from the refrigerant outlet, the second refrigerant outlet configured to release liquid refrigerant from the cavity.

(A17) In some of the implementations above: (1) the refrigerant inlet and the refrigerant outlet are positioned on a first side of the liquid-gas separator device; and (2) the cavity includes: (a) an inlet sub-cavity coupled to the refrigerant inlet; (b) an outlet sub-cavity coupled to the refrigerant outlet, the outlet sub-cavity distinct from the inlet sub-cavity; and (c) a cap fluidly coupling the inlet sub-cavity to the outlet sub-cavity, the cap positioned on a second side of the liquid-gas separator device, opposite the first side.

(A18) in some of the implementations above, the cavity is formed from an extruded metal.

In another aspect, some implementations include a method of transferring heat to a refrigerant. The method includes: (1) receiving the refrigerant via a refrigerant inlet of a liquid-gas separator device; (2) separating, within a refrigerant cavity of the liquid-gas separator device, vapor refrigerant from liquid refrigerant; (3) operating one or more electronic components thermally coupled to the liquid-gas separator device, whereby the one or more electronic components generate heat during operation; (4) transferring the heat generated by the one or more electronic components to the refrigerant; and (5) releasing a substantially vapor refrigerant via a refrigerant outlet of the liquid-gas separator device. In some instances, transferring the heat generated by the one or more electronic components to the refrigerant converts at least a portion of the refrigerant from liquid refrigerant to vapor refrigerant. In some instances, transferring the heat generated by the one or more electronic components to the refrigerant cools the one or more electronic components.

In yet another aspect, some implementations include a refrigerant system including: (1) means for receiving refrigerant via a refrigerant inlet of a liquid-gas separator device, wherein the refrigerant comprises liquid refrigerant and vapor refrigerant; (2) means for separating, with in a refrigerant cavity of the liquid-gas separator device, the vapor refrigerant from the liquid refrigerant; (3) means for operating one or more electronic components within the liquid-gas separator device; (4) means for transferring heat generated by the operation of the one or more electronic components to the refrigerant; (5) means for releasing the vapor refrigerant via a refrigerant outlet of the liquid-gas separator device; and (6) means for impeding release of the liquid refrigerant via the refrigerant outlet.

In yet another aspect, some implementations include a refrigerant device including: (1) a refrigeration section configured to couple to a refrigeration loop, the refrigeration section comprising: (a) a refrigerant inlet configured to receive refrigerant from the refrigeration loop; (b) a refrigerant outlet configured to release vapor refrigerant to the refrigeration loop; and (c) a cavity coupled to the refrigerant inlet and the refrigerant outlet, the cavity configured to separate liquid refrigerant from vapor refrigerant; and (2) an electronics board thermally coupled to the refrigeration section, such that in use, heat from the electronics board is transferred to the refrigerant.

Thus, devices and systems are provided with methods for cooling electronics and/or improving evaporation rates in an air-conditioning system, thereby increasing the effectiveness, efficiency, and user satisfaction with such systems. Such methods may complement or replace conventional methods for cooling electronics and/or improving evaporation rates in an air-conditioning system.

BRIEF DESCRIPTION OF THE DRAWINGS

For a better understanding of the various described implementations, reference should be made to the Detailed Description below, in conjunction with the following drawings in which like reference numerals refer to corresponding parts throughout the figures.

FIGS. 4A-4G illustrate a liquid-gas separator device in accordance with some implementations.

Like reference numerals refer to corresponding parts throughout the several views of the drawings.

DETAILED DESCRIPTION

Figure 1:
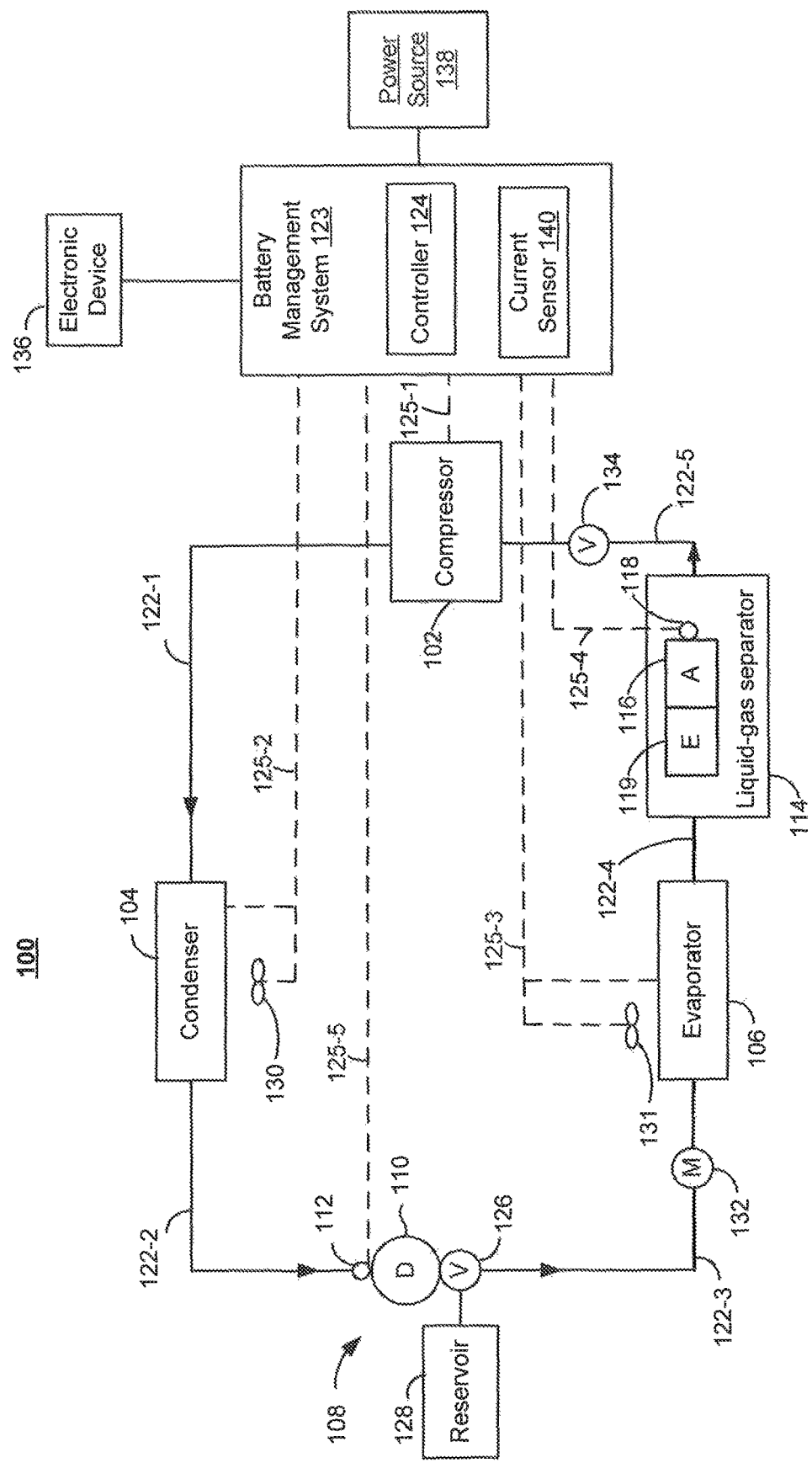
FIG. 1 is a block diagram illustrating an air-conditioning system in accordance with some implementations.

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

Many modifications and variations of this disclosure can be made without departing from its spirit and scope, as will be apparent to those skilled in the art. The specific implementations described herein are offered by way of example only, and the disclosure is to be limited only by the terms of the appended claims, along with the full scope of equivalents to which such claims are entitled.

Some implementations of the present disclosure are described in the context of air-conditioning systems for use in vehicles, and in particular, in the context of air-conditioning systems to cool different compartments or spaces of an over-the-road or off-road vehicle. In some implementations, the air-conditioning system includes, or is a component of, a heating, ventilation, and air-conditioning (HVAC) system. It is to be appreciated that the term vehicle as used herein may refer to trucks, such as tractor-trailer trucks or semi-trailer trucks, the scope of the present teachings is not so limited. The present teachings are also applicable, without limitation, to ears, vans, buses, trailers, boats, planes, and any other suitable vehicle.

In some implementations, the air-conditioning system includes a refrigerant reservoir either before the evaporator or after the evaporator. In some implementations, the system uses a refrigerant reservoir after the evaporator and before the compressor. In some implementations, an accumulator, which stores the excess refrigerant that has not changed phase into a complete vapor (i.e., is a mixture of both vapor and liquid), is used as the refrigerant reservoir.

In some implementations, the compressor is an electric brushless DC (BLDC) motor driven compressor that uses an electronic controller to electrically commutate the compressor motor. In some implementations, this controller has certain electrical components that need to be cooled to function properly.

In some implementations, the system combines both the refrigerant accumulator and the electronics cooling system. As the refrigerant flows into the accumulator the mixture of liquid and vapor refrigerant functions as a heat sink and transfers heat from the electronic board and into the refrigerant. In some implementations, the two components are separated by a thermal barrier, such as an aluminum pressure vessel designed for heat transfer and as a pressure vessel for the refrigerant.

The added advantage of using this combined accumulator and electronics cooler is that more of the refrigerant is changed from a liquid to a vapor. This can reduce the amount of liquid stored in the accumulator thereby reducing the risk of liquid being drawn into the compressor and damaging the compressor during the compression cycle.

In some implementations, the air-conditioning system includes at least one compressor, at least one condenser, at least one evaporator, refrigerant lines, and an energy source, such as a battery system. In some implementations, the refrigerant lines fluidly connect the compressor, condenser and evaporators to form a refrigerant circuit. In some implementations, a condenser includes at least one condenser fan. In some implementations, an evaporator includes at least one evaporator fan (also sometimes called a blower fan).

In some implementations, the air-conditioning system includes at least one user interface (e.g., touch screen) and at least one sensor (e.g., a thermostat). In some implementations, the energy source includes at least one battery or power source and a battery monitoring system. (also sometimes called a battery management system). In some implementations, the battery monitoring system includes at least one current sensor. In some implementations, the battery monitoring system includes a controller, such as an automatic temperature controller. In some implementations, the controller is electrically coupled to other components of the air-conditioning system (e.g., a compressor, a condenser, etc.) to control operation of these components.

FIG. 1 is a block diagram illustrating an air-conditioning system 100 (sometimes also called a refrigeration system or a refrigerant system) in accordance with some implementations. FIG. 1 shows the refrigeration system 100 including a compressor 102, a condenser 104, an evaporator 106, and refrigerant lines 122 fluidly connecting the compressor 102, condenser 104, and evaporator 106 to form a refrigerant circuit for circulating a refrigerant. In accordance with some implementations, the refrigerant circuit shown in FIG. 1 includes a receiver drier unit 108 and a liquid-gas separator device 114. In some implementations, the refrigerant circuit includes only one of the receiver drier unit 108 and the liquid-gas separator device 114.

In FIG. 1, the condenser 104 is disposed downstream of the compressor 102 and fluidly connected to the compressor 102 by a refrigerant line 122-1. The receiver drier unit 108 is disposed downstream of the condenser 104 and fluidly connected to the condenser 104 by a refrigerant line 122-2. In accordance with some implementations, the receiver drier unit 108 includes a receiver drier 110 and a first sensor 112. The evaporator 106 is disposed downstream of the receiver drier unit 108 and fluidly connected to the receiver drier unit 108 by a refrigerant line 122-3. As used herein, the term "downstream" refers to a position along a refrigerant line in the direction of the refrigerant flow. As used herein, the term "upstream" refers to a position along a refrigerant line opposite to the direction of the refrigerant flow.

In accordance with some implementations, the liquid-gas separator device 114 is disposed downstream of the evaporator 106 and fluidly connected to the evaporator 106 by a refrigerant line 122-4 and to the compressor 102 by a refrigerant line 122-5, thus forming a refrigerant circuit for circulating the refrigerant. In some implementations, the liquid-gas separator device 114 includes an accumulator 116, electronics 119, and a second sensor 118. In some implementations, the electronics 119 are thermally coupled to the accumulator 116 such that heat from the electronics 119 is transferred to refrigerant in the accumulator 116. In some implementations, the liquid-gas separator device 114 includes one or more connectors to mount to an inside of a vehicle engine compartment.

In some implementations, the liquid-gas separator device 114 further includes one or more fasteners configured to secure electronics to the accumulator 116. In some implementations, the electronics are thermally coupled to refrigerant in the accumulator 116 via the one or more fasteners. In some implementations, the electronics are thermally coupled to refrigerant in the accumulator 116 via a thermal material, such as thermal grease, thermal pad(s), and/or thermal paste. In some implementations, the electronics are thermally coupled to refrigerant in the accumulator 116 via the housing of the accumulator 116, the one or more fasteners, and a thermal material.

In some implementations, the accumulator 116 includes a refrigerant inlet configured to receive refrigerant from the refrigeration loop (e.g., from the evaporator 106); a refrigerant outlet configured to release vapor refrigerant to the refrigeration loop (e.g., to the compressor 102); and a cavity coupled to the refrigerant inlet and the refrigerant outlet, the cavity configured to separate liquid refrigerant from vapor refrigerant. In some implementations, the accumulator 116 includes a liquid-vapor separator within the cavity, the liquid-vapor separator coupled to the refrigerant outlet and configured to impede the liquid refrigerant from being released via the refrigerant outlet. In some implementations, the accumulator 116 is configured to utilize gravity to prevent the liquid refrigerant from being released via the refrigerant outlet. In some implementations, the accumulator 116 is configured to withstand pressure exerted by the refrigerant. In some implementations, the accumulator 116 includes a second outlet configured to release liquid refrigerant from the accumulator (e.g., to the evaporator 106 or the reservoir 128). In some implementations, the accumulator 116 includes an inlet cavity coupled to the refrigerant inlet; an outlet cavity coupled to the refrigerant outlet; and a cap fluidly coupling the inlet cavity to the outlet cavity. In some implementations, the refrigerant inlet and the refrigerant outlet are located on one side of the accumulator and the cap is positioned on the opposite side of the accumulator. In some implementations, the accumulator is formed from an extruded metal.

In some implementations, the electronics 119 includes controller electronics for the compressor 102. In some implementations, the electronics 119 includes controller electronics for the evaporator 106 and/or the condenser 104. In some implementations, the electronics 119 includes one or more of: a direct current (DC) to DC converter; an alternating current (AC) to AC converter; a DC to AC converter; an AC to DC converter; a power converter component; and a transformer. In some implementations, the electronics 119 includes one or more electronics boards thermally coupled to the accumulator 116, such that in use heat from the one or more electronics boards is transferred to refrigerant in the accumulator 116.

In some implementations, the first sensor 112 and the second sensor 118 are optionally any type of sensor suitable to measure temperature and/or pressure of the refrigerant, including but not limited to combined pressure and temperature transducers. In some implementations, the first sensor 112 includes a first temperature sensor and a first pressure sensor; and the second sensor 118 includes a second temperature sensor and a second pressure sensor. In some implementations, the first sensor 112 is disposed on the high pressure side of the refrigerant circuit, and optionally installed at the receiver drier 110 such as at the inlet, outlet, interior or other suitable location of the receiver drier 110. In some implementations, the second sensor 118 is disposed on the low pressure side of the refrigerant circuit, and optionally installed at the accumulator 116 such as at the inlet, outlet, interior or other suitable location of the accumulator 116. Having the first sensor 112 installed at the receiver drier 110 and/or the second sensor 118 at the accumulator 116 provides several advantages, including packaging and installation convenience, original equipment time saving, and easier leakage testing.

In some implementations, during operation of the air-conditioning system, the compressor 102 compresses a refrigerant into a compressed refrigerant. The compressor 102 is optionally any type of compressor including but not limited to a reciprocating compressor or rotary compressor. The condenser 104 condenses the refrigerant that has been compressed by the compressor 102. In some implementations, the receiver drier 110 of the receiver drier unit 108 temporarily stores the refrigerant and/or absorbs moisture, debris or other undesirable substances from the refrigerant that has been condensed by the condenser 104. In some implementations, the first sensor 112 measures temperature and pressure of the refrigerant that has been condensed by the condenser 104. The evaporator 106 vaporizes or evaporates the refrigerant that has been condensed by the condenser 104, providing cooling for desired use. In some implementations, the accumulator 116 restricts liquid refrigerant from entering the compressor 102, for example by temporarily storing excess liquid refrigerant at the accumulator 116, to prevent damage to the compressor 102. In some implementations, the second sensor 118 measures temperature and pressure of the refrigerant that has been vaporized/evaporated by the evaporator 106. It should be noted that depending on the operation and performance of the air-conditioning system, the condensed refrigerant at the receiver drier 110 and the vaporized/evaporated refrigerant at the accumulator 116 is in the form of a liquid, a vapor, or a mixture of liquid and vapor.

The air-conditioning system 100 also includes a power source 138 for powering one or more components of the system, such as condenser 104, evaporator 106, compressor 102, and the like. In some implementations, the power source 138 includes a solar cell, an electrical battery, an alternator, or the like. In some implementations, the power source 138 is belt driven from an internal combustion engine of a vehicle. In some implementations, the air-conditioning system 100 includes a battery management system 123 for managing various components of the system, such as power source 138. In some implementations, the battery management system 123 governs an amount of power drawn by each component of the air-conditioning system 100.

In some implementations, the battery management system 123 includes one or more controllers 124 and one or more current sensors 140. In some implementations, the controller 124 is electrically coupled to one or more components of the air-conditioning system, such as condenser 104 (e.g., via connection 125-2), evaporator 106 (e.g., via connection 125-3), and/or compressor 102 (e.g., via connection 125-1). In some implementations, the controller 124 is electrically coupled to a condenser blower 130 and an evaporator blower 131. In some implementations, the controller 124 is configured to monitor and control the amount of the power drawn by the evaporator 106, the amount of power drawn by the compressor 102, the refrigerant level in the refrigeration system, and/or other operations. For example, in FIG. 1, the controller 124 is electrically coupled via connection 125-4 to the first sensor 112 of the receiver drier unit 108 and coupled via connection 125-5 to the second sensor 118 of the liquid-gas separator device 114. In some implementations, controller 124 includes memory, such as volatile memory or non-volatile memory. In some implementations, controller 124 includes one or more processors. In some implementations, the controller 124, or components thereof, is thermally coupled to the liquid-gas separator device 114, such that heat generated by the controller 124 is transferred to refrigerant in the liquid-gas separator device 114.

In some implementations, the refrigeration system further includes an electronic valve 126 to inject refrigerant from a refrigerant reservoir 128 into the refrigeration system when the refrigerant charge level is below a predetermined refrigerant charge level. In some implementations, control of the electronic valve is controlled by the controller 124. As an example, FIG. 1 illustrates the electronic valve 126 installed at the receiver drier 110. In sonic implementations, the electronic valve 126 is selectively operated to allow flow of the refrigerant from the refrigerant reservoir 128 to the refrigerant circuit.

In some implementations, the battery management system 123 and/or the controller 124 is configured to calculate a compression ratio of the compressor 102. If the calculated compression ratio exceeds a specific compression ratio for a given condition, the battery management system 123 determines that a blockage has occurred in the refrigerant circuit. In some implementations, the battery management system 123 then examines various factors to determine a location of the blockage. For example, an abnormal sub-cooling level indicates a blockage in the condenser 104 and an abnormal super-cooling indicates a blockage in the evaporator 106.

In some implementations, the battery management system 123 and/or the controller 124 is configured to manage start-up of the air-conditioning system and detect any component failure during the start-up process. In some implementations, the controller 124 operates in conjunction with current sensor 140 to detect component failures. In some implementations, current sensor 140 is utilized to measure and/or monitor the current drawn from the power source 138 (e.g., current drawn by the condenser 104, the evaporator 106, and/or the compressor 102). In some implementations, the battery management system 123 governs operation of the air-conditioning system based on the measurements by the current sensor 140.

In some implementations, the battery management system 123 is communicatively coupled to an electronic device 136 and/or a server system (not shown). In some implementations, the electronic device includes a display, a user interface, a smartphone, and/or a computer. In some implementations, the electronic device 136 is located in proximity with the air-conditioning system. For example, the air-conditioning system is installed in a vehicle and the electronic device 136 is a display on the dashboard of the vehicle. In some implementations, the electronic device 136 is located remotely from the air-conditioning system. For example, the air-conditioning system is installed in a vehicle and the electronic device 136 is a device not connected with the vehicle, such as a smartphone or a computer at a dealer. The battery management system 123 outputs one or more signals to the electronic device 136. In some implementations, the signals optionally include data (e.g., the current drawn by a particular component, the refrigerant charge level, and the like), alerts (e.g., excessive current drawn by a particular component), maintenance request, and the like.

In some implementations, the air-conditioning system includes one or more additional components such as air blowers, metering devices, flow control valves, and the like.

In accordance with some implementations, FIG. 1 illustrates the air-conditioning system including a condenser blower 130 electrically coupled to the battery management system 123 and positioned proximate the condenser 104. In some implementations, the condenser blower 130 includes one or more fans. In some implementations, the condenser blower 130 is a component of the condenser 104. In some implementations, the condenser blower 130 is configured to blow ambient air and/or air from an air intake of the engine over the condenser 104. The amount of airflow over the condenser 104 affects the temperature and pressure of the refrigerant at the high pressure side of the refrigerant circuit and hence the efficiency of the air-conditioning system. Accordingly, in some implementations, to enhance the efficiency of the air-conditioning system, the battery management system 123 controls a speed of the condenser blower 130 based at least in part on the temperature measured by the first sensor 112, the pressure measured by the first sensor 112, the temperature measured by the second sensor 118, the pressure measured by the second sensor 118, and/or the current measured by current sensor 140.

In accordance with some implementations, FIG. 1 illustrates the air-conditioning system including an evaporator blower 131 electrically coupled to the battery management system 123 and positioned proximate the evaporator 106. In some implementations, the evaporator blower 131 includes one or more fans. In some implementations, the evaporator blower 131 is a component of the evaporator 106. In some implementations, the evaporator blower 131 is configured to blow air past the evaporator 106, thereby cooling the air.

The air-conditioning system as illustrated in FIG. 1 also includes a metering device 132 disposed upstream of the evaporator 106 and configured for controlling flow of the refrigerant into the evaporator 106. In some implementations, the metering device 132 includes a thermal expansion valve or a capillary tube. In some implementations, the air-conditioning system further includes a flow control valve 134 disposed upstream of the compressor 102 and configured to selectively restrict or permit flow of the refrigerant to the compressor 102.

In some implementations, the battery management system 123, or components thereof, is thermally coupled to the accumulator 116, such that heat generated by the battery management system 123 is transferred to refrigerant in the accumulator 116. For example, in accordance with some implementations, the battery management system 123, or components thereof, are included in the electronics 119. In some implementations, one or more controllers for the air-conditioning system, such as controller 124, are thermally coupled to the accumulator 116, such that heat generated by the controller(s) is transferred to refrigerant in the accumulator 116. For example, in accordance with some implementations, the one or more controllers are included in the electronics 119.

Figure 2:
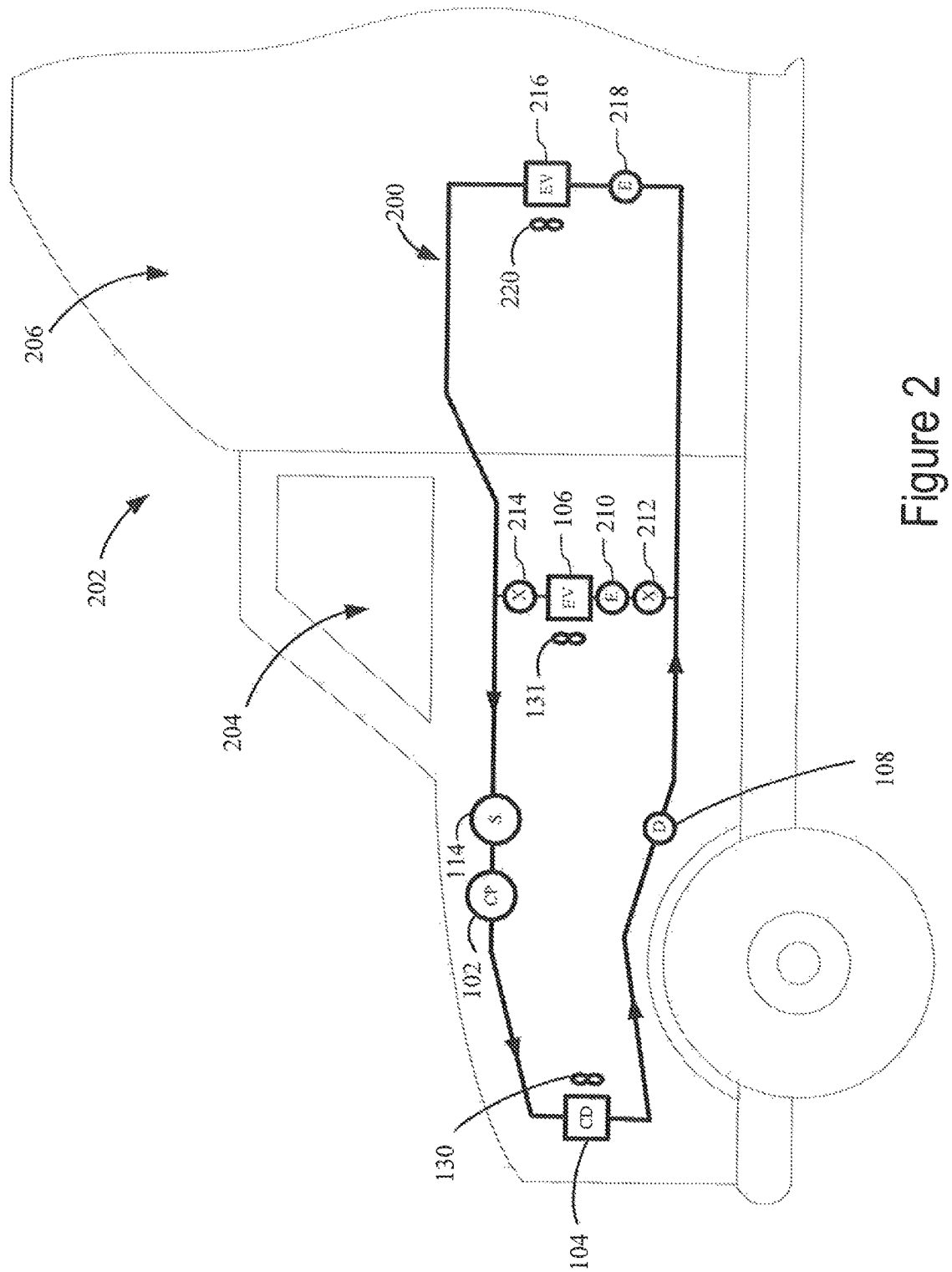
FIG. 2 is a block diagram illustrating an air-conditioning system in a vehicle in accordance with some implementations.

FIG. 2 is a block diagram illustrating an air-conditioning system 200 in a vehicle 202 in accordance with some implementations. The air-conditioning system 200 includes liquid-gas separator device 114, compressor 102, condenser 104 with condenser blower 130, drier unit 108, and a first evaporator (evaporator 106) with evaporator blower 131. The air-conditioning system 200 also includes a second evaporator 216 with evaporator blower 220, metering devices 210 and 218 (e.g., expansion values), and shut-off valves 212 and 214. In some implementations, metering device 210 is configured to control flow rate of the refrigerant into the first evaporator 106 and metering device 218 is configured to control flow rate of the refrigerant into the second evaporator 216.

As shown in FIG. 2, the vehicle 202 has a cab compartment 204 where an operator (e.g., driver) operates the vehicle and a sleeper compartment 206 where the operator can rest. In some implementations, the sleeper compartment 206 is physically partitioned from the cab compartment 204. In some implementations, the first evaporator 106 is in thermal communication with the cab compartment 204, while the second evaporator 216 is in thermal communication with the sleeper compartment 206. In some implementations, the air-conditioning system 200 includes one or more thermal sensors located within the cab compartment 204 to monitor the ambient temperature in the cab compartment; and one or more thermal sensors located in the sleeper compartment 206 to monitor the ambient temperature in the sleeper compartment 206. In some implementations, the air-conditioning system 200 includes a thermostat located within the cab compartment 204 to enable a user to set a desired temperature for the cab compartment 204; and a thermostat located in the sleeper compartment 206 to enable a user to set a desired temperature for the sleeper compartment 206. In some implementations, the condenser 104, the compressor 102, and/or the liquid-gas separator device 114 are located within an engine compartment of the vehicle.

In accordance with a determination that cooling is desired in both the cab compartment 204 and the sleeper compartment 206, the first shut-off valve 212 and the second shut-off valve 214 are opened, either manually or automatically, so that the condensed refrigerant flows through both the first and second evaporators and provides cooling to both the cab and sleeper compartments. In accordance with a determination that cooling is only desired in the sleeper compartment (e.g., when the vehicle is parked and no one is in the cab compartment), the first and second shut-off valves are closed. In some implementations, the first and second shut-off valves 212 and 214 are installed at both the refrigerant inlet and outlet of the first evaporator 106; and closing the first and second shut-off valves prevents the refrigerant from entering the first evaporator 106 from both sides and thus prevents the refrigerant from collecting or accumulating in the first evaporator 106. As a result, the condensed refrigerant flows only through the second evaporator 216 and thus enhances the cooling effect of the second evaporator 216. In some implementations, two or more shut-off valves (not shown) are used to shut-off flow to the second evaporator 216. In some implementations, shut-off valves 212 and 214 are located and configured such that flow is selectively enabled/disabled to both the first evaporator 106 and the second evaporator 216.

Figure 3:
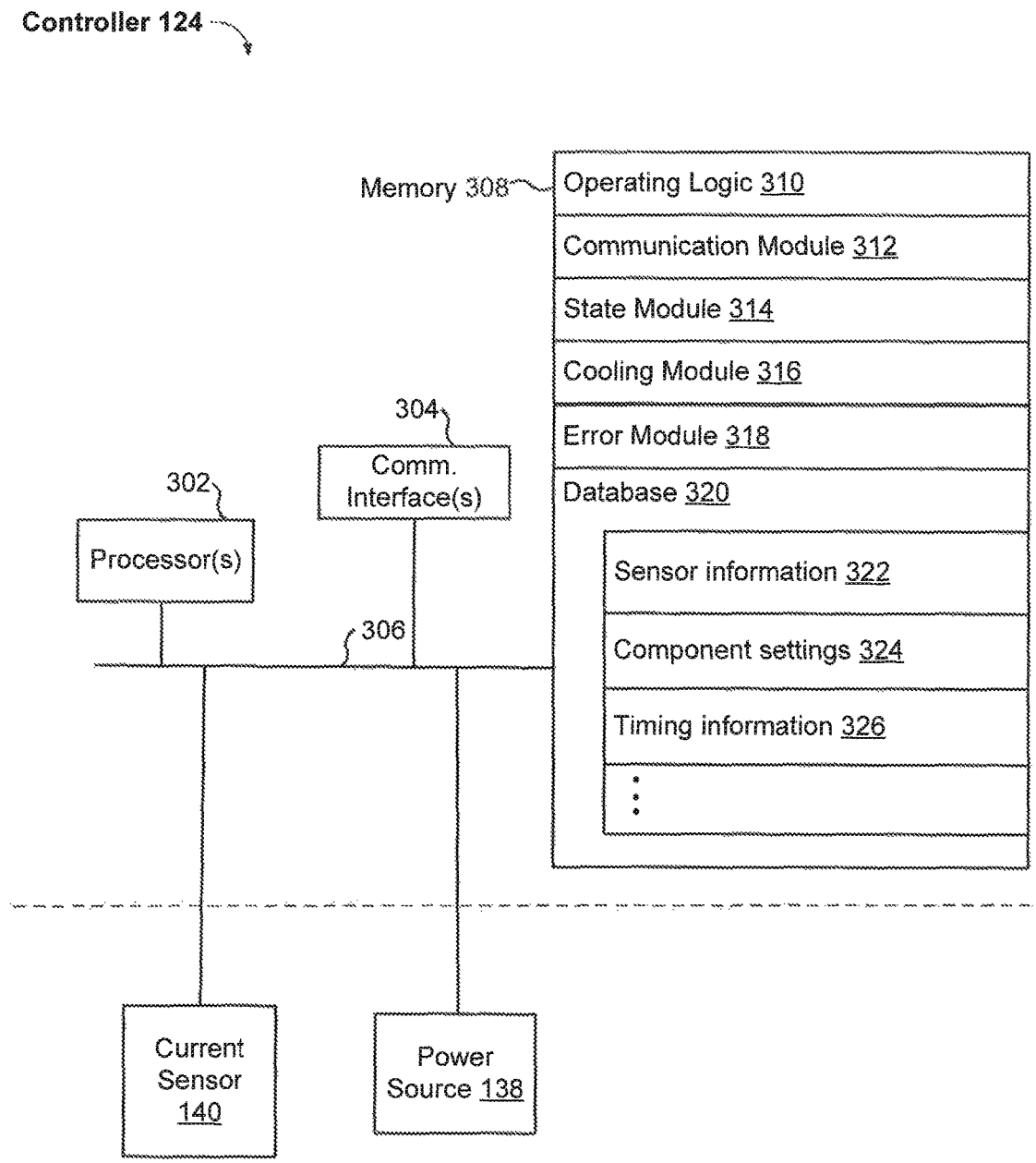
FIG. 3 is a block diagram illustrating a representative controller in accordance with some implementations.

FIG. 3 is a block diagram illustrating a representative controller 124 in accordance with some implementations. In some implementations, the controller 124 includes one or more processing units (e.g., CPUs, ASICs, FPGAs, microprocessors, and the like) 302, one or more communication interfaces 304, memory 308, and one or more communication buses 306 for interconnecting these components (sometimes called a chipset). In some implementations, the controller 124 includes one or more input devices, such as one or more buttons for receiving input. In some implementations, the controller 124 includes one or more output devices, such as one or more indicator lights, a sound card, a speaker, a small display for displaying textual information and error codes, etc. In some implementations, the controller 124 includes a location detection device, such as a GPS (global positioning satellite) or other geo-location receiver, for determining the location of the controller 124. The controller 124 is coupled to the current sensor 140 and the power source 138, as shown in FIG. 1.

Communication interfaces 304 include, for example, hardware capable of data communications using any of a variety of custom or standard wireless protocols (e.g., IEEE 802.15.4, Wi-Fi, ZigBee, 6LoWPAN, Thread, Z-Wave, Bluetooth Smart, ISA100.11a, WirelessHART, MiWi, etc.) and/or any of a variety of custom or standard wired protocols (e.g., Ethernet, HomePlug, etc.), or any other suitable communication protocol, including communication protocols not yet developed as of the filing date of this document.

Memory 308 includes high-speed random access memory, such as DRAM, SRAM, DDR SRAM, or other random access solid state memory devices; and, optionally, includes non-volatile memory, such as one or more magnetic disk storage devices, one or more optical disk storage devices, one or more flash memory devices, or one or more other non-volatile solid state storage devices. Memory 308, or alternatively the non-volatile memory within memory 308, includes a non-transitory computer-readable storage medium. In some implementationss, memory 308, or the non-transitory computer readable storage medium of memory 308, stores the following programs, modules, and data structures, or a subset or superset thereof:

- Operating logic 310 including procedures for handling various system services and for performing hardware dependent tasks;
- Communication module 312 for connecting to and communicating with other network devices connected to one or more networks via the one or more communication interfaces 304 (e.g., wired or wirelessly connected);
- State module 314 for determining an operating state of the system (e.g., of air-conditioning system 100, FIG. 1) and/or for setting/adjusting the operating state of the system;
- Cooling module 316 for managing cooling operations of the system (e.g., temperature settings, fan speeds, power settings, etc.);
- Error module 318 for determining whether one or more error conditions are present and/or conveying the one or more error conditions to a user of the system and/or initiating remedial action in response to the one or more error conditions; and
- Database 320, including but not limited to:
  - Sensor information 322 for storing and managing data received, detected, and/or transmitted by one or more sensors of the system (e.g., current sensor 140, sensor 118, and/or sensor 112 in FIG. 1);
  - Component settings 324 for storing and managing operational settings for one or more components of the system (e.g., condenser 104, compressor 102, and evaporator 106); and
  - Timing information 326 for storing and managing timing information related to operation and/or testing of the system.

Each of the above identified elements (e.g., modules stored in memory 308 of controller 124) corresponds to a set of instructions for performing a function described herein. The above identified modules or programs (i.e., sets of instructions) need not be implemented as separate software programs, procedures, or modules, and thus various subsets of these modules may be combined or otherwise rearranged in various implementations. In some implementations, memory 308, optionally, stores a subset of the modules and data structures identified above. Furthermore, memory 308, optionally, stores additional modules and data structures not described above. For example, memory 308 optionally stores a heating module (not shown) for managing heating operations of the system.

Figures 4C, 4D:
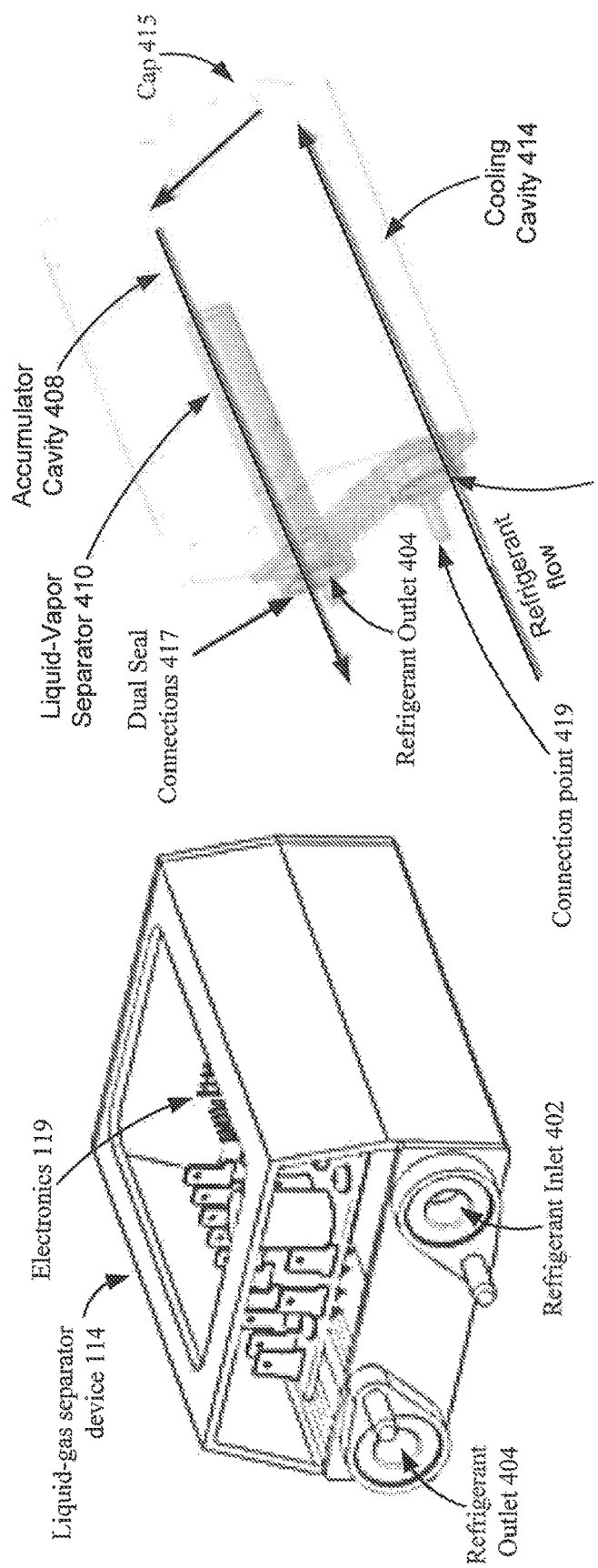

FIGS. 4A-4G illustrate various views of a liquid-gas separator device 114 in accordance with some implementations. FIG. 4A shows the liquid-gas separator device 114 with refrigerant inlet 402, refrigerant outlet 404, casing 407, and cover 405. In some implementations, the casing 407 and/or the cover 405 is comprised of metal, such as aluminum or steel. FIG. 4B shows the liquid-gas separator device 114 without the cover 405 and housing electronics 119 (e.g., compressor controller electronics). In some implementations, the electronics 119 include a plurality of electrical connectors and/or a plurality of transistors, such as field-effect transistors (FETs). In some implementations, the electronics 119 are mounted on an electrical board. In some implementations, the cover 405 is affixed to the liquid-gas separator device 114 after the electronics 119 are housed within. FIG. 4C shows another view of the liquid-gas separator device 114 with electronics 119, refrigerant outlet 404, and refrigerant inlet 402 and without the cover 405. In some implementations, the liquid-gas separator device 114 is configured to be mounted vertically without the refrigerant inlet 402 and the refrigerant outlet 404 on the bottom.

FIG. 4D shows the flow of refrigerant through the liquid-gas separator device 114. The refrigerant enters the device via the refrigerant inlet 402. The refrigerant then flows through the cooling cavity 414. In the cooling cavity 414 heat is transferred from the electronics 119 to the refrigerant. In some cases, the transferred heat converts at least a portion of the liquid refrigerant in the cooling cavity 414 into vapor refrigerant. The refrigerant then flows into the cap 413 and into the accumulator cavity 408. The liquid-vapor separator 410 in the accumulator cavity 408 separates the liquid refrigerant from the vapor refrigerant. The vapor refrigerant then exits the device via the refrigerant outlet 404. FIG. 4E shows another view of the flow of refrigerant through the liquid-gas separator device 114. FIG. 4E also shows the electronics 119 mounted within the device. FIG. 4D also shows the dual seal connections 417 in accordance with some implementations. In some implementations, the refrigerant inlet 402 and/or the refrigerant outlet 404 include one or more of: a refrigerant tube, one or more washers, and a connection point 419 for connecting a refrigerant hose.

FIG. 4F shows the liquid-gas separator device 114 without the casing 407 and with fasteners 416. In some implementations, the fasteners 416 are configured to affix the electronics 119 (e.g., an electronics board with the electronics 119) to the liquid-gas separator device 114. In some implementations, the fasteners 416 are configured to transfer heat generated by the electronics 119 to refrigerant in the cooling cavity 414. In some implementations, the fasteners 416 comprise screws, bolts, anchors, and the like.

Figure 4G:
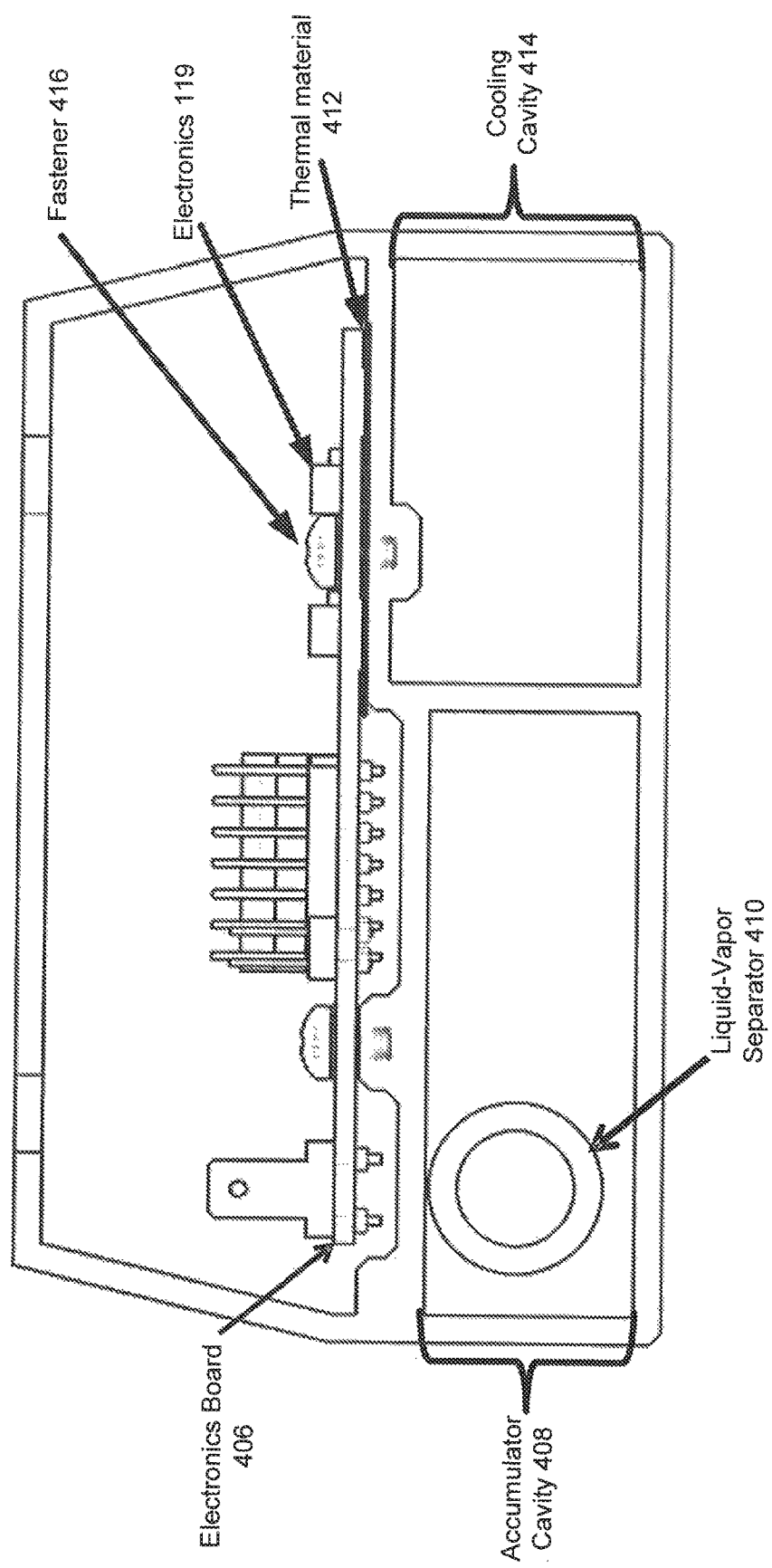

FIG. 4G shows a cross-sectional view of the liquid-gas separator device 114; FIG. 4G shows an electronics board 406 with electronics 119 mounted to the device via fastener 416. FIG. 4G also shows a thermal material 412 applied between the electronics board 406 and the cooling cavity 414 of the liquid-gas separator device 114. FIG. 4G also shows the accumulator cavity 408 with the liquid-vapor separator device 410.

Figure 5:
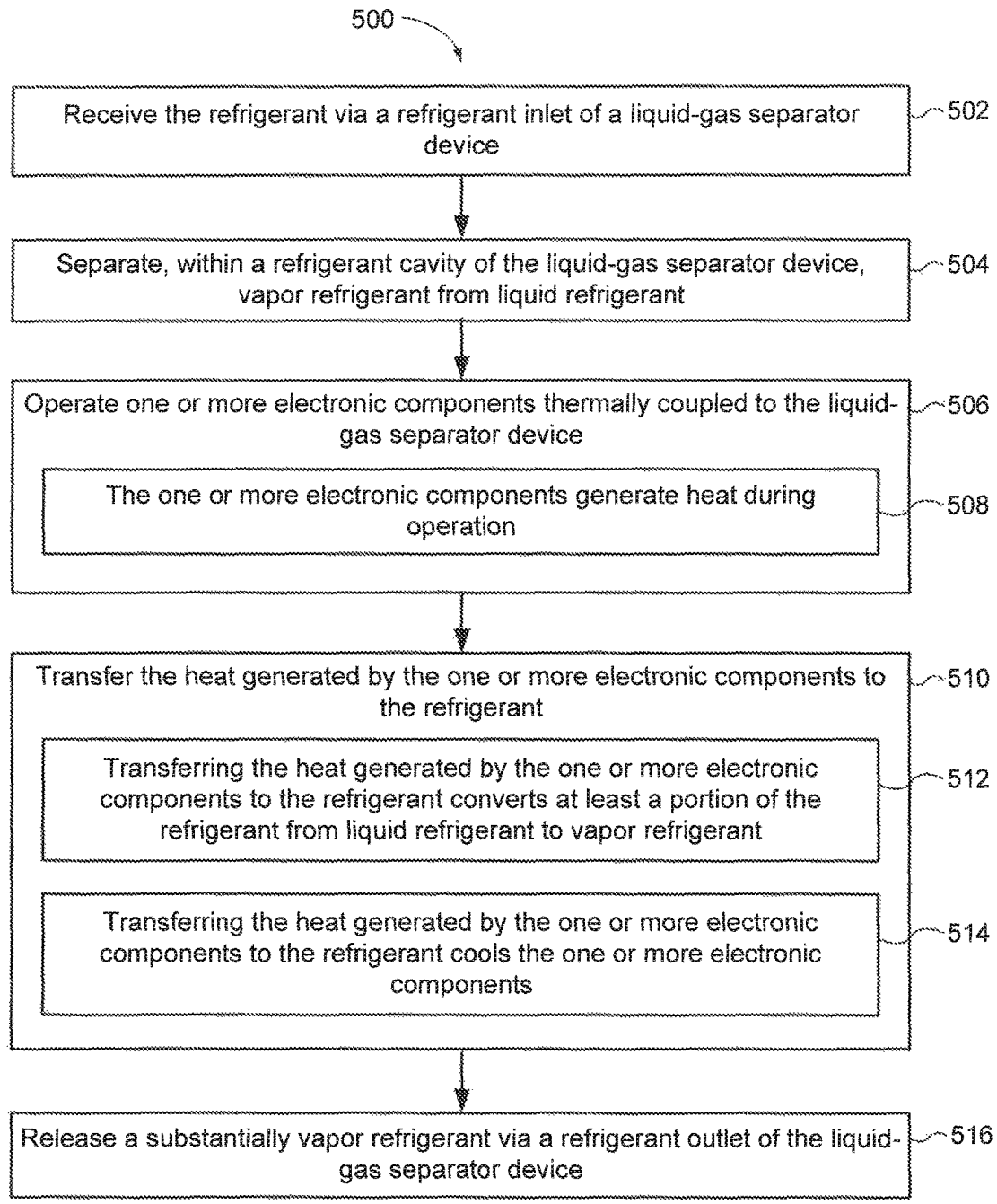
FIG. 5 illustrates a flowchart representation of a method for cooling electronics, in accordance with some implementations.

FIG. 5 illustrates a flowchart representation of a method 500 for cooling electronics in accordance with some implementations. In some implementations, the method 500 is performed by an air-conditioning system 100 or one or more components of the air-conditioning system, such as liquid-gas separator device 114, FIG. 1. In sonic implementations, method 500 is performed by a device coupled to the air-conditioning system 100. In some implementations, the operations of the method 500 described herein are entirely interchangeable, and respective operations of the method 500 are performed by any of the aforementioned devices, systems, or combination of devices and/or systems. In some implementations, method 500 is governed by instructions that are stored in a non-transitory computer-readable storage medium and that are executed by one or more processors of an air-conditioning system, such as controller 124. FIG. 1. For convenience, method 500 is described below as being performed by a device, such as the liquid-gas separator device 114 in FIG. 1.

The device receives (502) refrigerant via a refrigerant inlet (e.g., refrigerant inlet 402, FIG. 4A). In some implementations, the refrigerant is received via a refrigerant hose coupled to the refrigerant inlet. In sonic implementations, the refrigerant is received from an evaporator coupled to the device, such as the evaporator 106, FIG. 1. In some implementations, the received refrigerant includes a mixture of liquid and vapor refrigerant. In some implementations, the refrigerant comprises ammonia, sulfur dioxide, hydroflouro-carbons (e.g., R-134a), hydrofluoroolefins (e.g., or 1234yf), and/or hydrocarbons such as propane.

The device separates (504), within a refrigerant cavity of the liquid-gas separator device, vapor refrigerant from liquid refrigerant. In some implementations, the device utilizes a liquid-vapor separator 410 to separate the vapor refrigerant from the liquid refrigerant. In some implementations, the device utilizes gravity to separate the vapor refrigerant from the liquid refrigerant.

The device operates (506) one or more electronic components (e.g., electronics 119) thermally coupled to the refrigerant cavity. In some implementations, the electronic components comprise controller electronics for a compressor (e.g., compressor 102), an evaporator (e.g., evaporator 106), and/or a condenser (e.g., condenser 104). In some implementations, the electronic components include power generation and/or conversion electronics, such as electronics of battery management system 123. The one or more electronics generate (508) heat during operation.

The device transfers (510) the heat generated by the one or more electronic components to the refrigerant. In some implementations the heat is transferred via one or more fasteners (e.g., fasteners 416) and/or one or more thermal materials (e.g., thermal material 412). In some cases, transferring the heat generated by the one or more electronic components to the refrigerant converts (512) at least a portion of the refrigerant from liquid refrigerant to vapor refrigerant. In some cases, transferring the heat generated by the one or more electronic components to the refrigerant cools (514) the one or more electronic components.

The device releases (516) a substantially vapor refrigerant via a refrigerant outlet (e.g., refrigerant outlet 404). In some implementations, the device release the substantially vapor refrigerant to a compressor (e.g., compressor 102). In some implementations, the device releases a substantially liquid refrigerant via a liquid outlet. In some implementations, the device releases the substantially liquid refrigerant to an evaporator (e.g., evaporator 106) or a refrigerant reservoir (e.g., reservoir 128).

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, fir software or any combination thereof.

It will also be understood that, although the terms first, second, etc. are, in some instances, used herein to describe various elements, these elements should not be limited by these terms. These terms are only used to distinguish one element from another. For example, a first condition could be termed a second condition, and, similarly, a second condition could be termed a first condition; without departing from the scope of the various described implementations. The first condition and the second condition are both conditions, but they are not the same condition.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific implementations. However, the illustrative discussions above are not intended to the exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. A refrigerant system, comprising:
a liquid-gas separator device including:
a refrigeration section configured to couple to a refrigeration loop, the refrigeration section comprising:
a refrigerant inlet positioned on a first side of the liquid-gas separator and configured to receive refrigerant from the refrigeration loop;
a refrigerant outlet positioned on the first side of the liquid-gas separator and configured to release vapor refrigerant to the refrigeration loop;
a cavity coupled to the refrigerant inlet and the refrigerant outlet, the cavity configured to separate liquid refrigerant from vapor refrigerant, the cavity comprising an inlet sub-cavity, an outlet sub-cavity, and a cap sub-cavity, wherein:
the inlet sub-cavity is coupled to the refrigerant inlet;
the outlet sub-cavity is coupled to the refrigerant outlet;
the outlet sub-cavity is separated from the inlet sub-cavity by a first wall; and
the cap sub-cavity is positioned on a second side of the liquid-gas separator device, opposite the first side, and fluidly couples the inlet sub-cavity with the outlet sub-cavity; and
an electronics board mounted on a second wall of the refrigeration section such that the electronics board spans, and is thermally coupled to, at least a portion of the inlet sub-cavity and at least a portion of the outlet sub-cavity so that, in use, heat from the electronics board is transferred to the refrigerant.

2. The refrigerant system of claim 1, further comprising a compressor coupled downstream to the refrigerant outlet of the liquid-gas separator device, the compressor configured to compress refrigerant released by the liquid-gas separator device.

3. The refrigerant system of claim 2, further comprising an evaporator coupled upstream to the refrigerant inlet of the liquid-gas separator device, the evaporator configured to evaporate refrigerant.

4. The refrigerant system of claim 3, further comprising a condenser coupled upstream to the evaporator and downstream to the compressor, the condenser configured to condense refrigerant that has been compressed by the compressor.

5. The refrigerant system of claim 1, wherein the electronics board is thermally coupled to the refrigeration section, such that in use, the heat transferred to the refrigerant converts at least a portion of the refrigerant in the inlet sub-cavity, and at least a portion of the refrigerant in the outlet sub-cavity, from liquid refrigerant to vapor refrigerant.

6. The refrigerant system of claim 1, wherein the electronics board is thermally coupled to the refrigeration section, such that in use, the heat transferred from the electronics boards cools electrical components on the electronics board.

7. The refrigerant system of claim 1, wherein the liquid-gas separator device further includes compressor controller electronics mounted on the electronics board.

8. The refrigerant system of claim 1, wherein the liquid-gas separator device further includes, mounted on the electronics board, at least one of:
a direct current (DC) to DC converter;
an alternating current (AC) to AC converter;
a DC to AC converter;
an AC to DC converter;
a power converter component;
a power transistor; and
a transformer.

9. The refrigerant system of claim 1, wherein the liquid-gas separator device further includes one or more additional electronics boards thermally coupled to the refrigeration section, such that in use heat from the one or more additional electronics boards is transferred to the refrigerant.

10. The refrigerant system of claim 1, wherein the liquid-gas separator device further includes a liquid-vapor separator component within the outlet sub-cavity, the liquid-vapor separator component coupled to the refrigerant outlet and configured to impede the liquid refrigerant from being released via the refrigerant outlet.

11. The refrigerant system of claim 10, wherein the liquid-vapor separator component is configured to utilize gravity to prevent the liquid refrigerant from being released via the refrigerant outlet.

12. The refrigerant system of claim 1, wherein the liquid-gas separator device includes one or more connectors to mount to an inside of a vehicle engine compartment.

13. The refrigerant system of claim 1, wherein the liquid-gas separator device further includes one or more thermally-conductive fasteners configured to secure the electronics board to the refrigeration section,
wherein the electronics board is thermally coupled to the cavity via the one or more thermally-conductive fasteners.

14. The refrigerant system of claim 13, wherein the electronics board is thermally coupled to the cavity via a thermal material.

15. The refrigerant system of claim 13, wherein one or more thermally-conductive fasteners includes:
a first fastener securing, and thermally-coupling, the electronics board to a portion of the second wall adjacent to the inlet sub-cavity, and
a second fastener securing, and thermally-coupling, the electronics board to a portion of the second wall adjacent to the outlet sub-cavity.

16. The refrigerant system of claim 1, wherein the refrigeration section is configured to withstand pressure exerted by refrigerant within the cavity.

17. The refrigerant system of claim 1, wherein the liquid-gas separator device further includes a second refrigerant outlet distinct from the refrigerant outlet, the second refrigerant outlet configured to release liquid refrigerant from the cavity.

18. The refrigerant system of claim 1, wherein the cavity is formed from at least one of:
an extruded metal;
a diecast metal; and
a machined housing.

19. The refrigerant system of claim 1, wherein the liquid-gas separator device is configured and arranged such that, in use, refrigerant enters via the refrigerant inlet and flows through the inlet sub-cavity to the outlet sub-cavity via the cap sub-cavity prior to exiting via the refrigerant outlet.

20. The refrigerant system of claim 1, wherein the liquid-gas separator device further comprises a casing configured and arranged to enclose at least a portion of each of the refrigeration section and the electronics board.

* * * * *